United States Patent
Clark et al.

(10) Patent No.: US 8,951,345 B2
(45) Date of Patent: Feb. 10, 2015

(54) HIGH TEMPERATURE SUPPORT APPARATUS AND METHOD OF USE FOR CASTING MATERIALS

(75) Inventors: Roger F. Clark, Knoxville, MD (US); James A. Cliber, Emmitsburg, MD (US); Nathan G. Stoddard, Gettysburg, PA (US); Jesse I. Gerber, West Keansburg, NJ (US); Raymond J. Roberts, Moorestown, NJ (US); Mark A. Wilmerton, Tabernacle, NJ (US)

(73) Assignee: AMG Idealcast Solar Corporation, Wayne, PA (US)

( * ) Notice: Subject to any disclaimer, the term of this patent is extended or adjusted under 35 U.S.C. 154(b) by 890 days.

(21) Appl. No.: 12/548,001

(22) Filed: Aug. 26, 2009

(65) Prior Publication Data

US 2010/0061916 A1    Mar. 11, 2010

Related U.S. Application Data

(60) Provisional application No. 61/144,253, filed on Jan. 13, 2009, provisional application No. 61/092,186, filed on Aug. 27, 2008.

(51) Int. Cl.
  *C30B 35/00*    (2006.01)
  *C30B 29/06*    (2006.01)
  *C30B 11/00*    (2006.01)
  *C30B 15/10*    (2006.01)
  *F27B 14/08*    (2006.01)

(52) U.S. Cl.
  CPC ............... *C30B 29/06* (2013.01); *C30B 11/002* (2013.01); *C30B 11/007* (2013.01); *C30B 15/10* (2013.01); *C30B 35/002* (2013.01); *C30B 35/005* (2013.01); *F27B 14/08* (2013.01)
  USPC ........... 117/206; 117/200; 117/205; 117/216; 65/347

(58) Field of Classification Search
  USPC .................... 117/200, 205, 206, 218; 65/347
  See application file for complete search history.

(56) References Cited

U.S. PATENT DOCUMENTS

| | | | | |
|---|---|---|---|---|
| 2,579,885 | A | | 12/1951 | Upper |
| 3,658,119 | A | * | 4/1972 | Hunt et al. ..................... 164/512 |
| 3,677,669 | A | * | 7/1972 | Bliemeister ....................... 425/6 |
| 3,790,338 | A | * | 2/1974 | Duca ............................. 432/247 |
| 4,119,428 | A | * | 10/1978 | DeAngelis et al. ............. 65/287 |
| 4,225,378 | A | * | 9/1980 | Garrison ......................... 117/27 |
| 5,271,033 | A | * | 12/1993 | Bethge et al. ................. 373/143 |

(Continued)

FOREIGN PATENT DOCUMENTS

| | | |
|---|---|---|
| DE | 10248151 | 5/2004 |
| FR | 2 819 803 | 7/2002 |

(Continued)

*Primary Examiner* — Matthew Song
(74) *Attorney, Agent, or Firm* — Barnes & Thornburg; Thomas J. McWilliams; Edward F. Behm, Jr.

(57) ABSTRACT

This invention relates to a system and a method of use for large ceramic member support and manipulation at elevated temperatures in non-oxidizing atmospheres, such as using carbon-carbon composite materials for producing high purity silicon in the manufacture of solar modules. The high temperature apparatus of this invention includes one or more support ribs, one or more cross braces in combination with the one or more support ribs, and a shaped support liner positionable upon the one or more support ribs and the one or more cross braces.

12 Claims, 2 Drawing Sheets

(56) References Cited

U.S. PATENT DOCUMENTS

| | | | |
|---|---|---|---|
| 5,800,924 A * | 9/1998 | Metter | 428/408 |
| 5,968,267 A * | 10/1999 | Li | 117/221 |
| 6,616,756 B2 | 9/2003 | Thebault et al. | 117/13 |
| 6,783,621 B1 | 8/2004 | Georges et al. | 156/173 |
| 6,837,952 B1 | 1/2005 | Guirman et al. | 156/148 |
| 7,235,132 B2 | 6/2007 | Kompalik | 117/200 |
| 2004/0055733 A1 | 3/2004 | Jackson et al. | 164/489 |
| 2004/0200408 A1* | 10/2004 | Wang et al. | 117/208 |
| 2004/0211354 A1* | 10/2004 | Guirman et al. | 117/13 |
| 2004/0226317 A1* | 11/2004 | Kompalik | 65/59.5 |
| 2005/0115493 A1* | 6/2005 | Radkevich et al. | 117/200 |
| 2007/0092762 A1 | 4/2007 | Corman et al. | 428/701 |
| 2007/0169684 A1 | 7/2007 | Stoddard | 117/13 |
| 2007/0169685 A1 | 7/2007 | Stoddard | 117/13 |

FOREIGN PATENT DOCUMENTS

| | | |
|---|---|---|
| GB | 956674 | 4/1964 |
| JP | 10 330185 | 12/1998 |
| JP | 2000 247779 | 9/2000 |
| JP | 2000 247780 | 9/2000 |
| JP | 2005 179153 | 7/2005 |
| JP | 2005 187198 | 7/2005 |
| WO | WO 02/072926 | 9/2002 |

* cited by examiner

HIGH TEMPERATURE SUPPORT APPARATUS AND METHOD OF USE FOR CASTING MATERIALS

This application claims the benefit of U.S. Provisional Application No. 61/144,253, filed Jan. 13, 2009, and U.S. Provisional Application No. 61/092,186 filed Aug. 27, 2008, the entirety of both are expressly incorporated herein by reference.

This invention was made with U.S. Government support under Cooperative Agreement No.: DE-FC36-07G017049 under prime contract with the National Renewable Energy Laboratory awarded by the Department of Energy. The Government has certain rights in this invention.

BACKGROUND

1. Technical Field

This invention relates to a system and a method of use for large ceramic member support and manipulation at elevated temperatures in non-oxidizing atmospheres, such as using carbon-carbon composite materials for producing high purity silicon in the manufacture of solar modules.

2. Discussion of Related Art

Photovoltaic cells convert light into electric current. One of the most important features of a photovoltaic cell is its efficiency in converting light energy into electrical energy. Although photovoltaic cells can be fabricated from a variety of semiconductor materials, silicon is generally used because it is readily available at reasonable cost, and because it has a suitable balance of electrical, physical, and chemical properties for use in fabricating photovoltaic cells.

In a known procedure for the manufacture of photovoltaic cells, silicon feedstock is doped with a dopant having either a positive or negative conductivity type, melted, and then crystallized by pulling crystallized silicon out of a melt zone into ingots of monocrystalline silicon (via the Czochralski (CZ) or float zone (FZ) methods). For a FZ process, solid material is fed through a melting zone, melted upon entry into one side of the melting zone, and re-solidified on the other side of the melting zone, generally by contacting a seed crystal.

Recently, a new technique for producing monocrystalline or geometric multicrystalline material in a crucible solidification process (i.e. a cast-in-place or casting process) has been invented, as disclosed in U.S. patent application Ser. Nos. 11/624,365 and 11/624,411, and published in U.S. Patent Application Publication Nos.: 20070169684A1 and 20070169685A1, filed Jan. 18, 2007. Casting processes for preparing multicrystalline silicon ingots are known in the art of photovoltaic technology. Briefly, in such processes, molten silicon is contained in a crucible, such as a quartz crucible, and is cooled in a controlled manner to permit the crystallization of the silicon contained therein. The block of cast crystalline silicon that results is generally cut into bricks having a cross-section that is the same as or close to the size of the wafer to be used for manufacturing a photovoltaic cell, and the bricks are sawn or otherwise cut into such wafers. Multi-crystalline silicon produced in such manner is composed of crystal grains where, within the wafers made therefrom, the orientation of the grains relative to one another is effectively random. Monocrystalline or geometric multicrystalline silicon has specifically chosen crystal orientations and (in the latter case) grain boundaries, and can be formed by the new casting techniques disclosed in the above-mentioned patent applications by melting in a crucible the solid silicon into liquid silicon in contact with a large seed layer that remains partially solid during the process and through which heat is extracted during solidification, all while remaining in the same crucible. As used herein, the term 'seed layer' refers to a crystal or group of crystals with desired crystal orientations that form a continuous layer. They can be made to conform to one side of a crucible for casting purposes.

In order to produce high quality cast ingots, several conditions should be met. Firstly, as much of the ingot as possible should have the desired crystallinity. If the ingot is intended to be monocrystalline, then the entire usable portion of the ingot should be monocrystalline, and likewise for geometric multicrystalline material. Secondly, the silicon should contain as few imperfections as possible. Imperfections can include individual impurities, agglomerates of impurities, intrinsic lattice defects and structural defects in the silicon lattice, such as dislocations and stacking faults. Many of these imperfections can cause a fast recombination of electrical charge carriers in a functioning photovoltaic cell made from crystalline silicon. This can cause a decrease in the efficiency of the cell.

Many years of development have resulted in a minimal amount of imperfections in well-grown CZ and FZ silicon. Dislocation free single crystals can be achieved by first growing a thin neck where all dislocations incorporated at the seed are allowed to grow out. The incorporation of inclusions and secondary phases (for example silicon nitride, silicon oxide or silicon carbide particles) is avoided by maintaining a counter-rotation of the seed crystal relative to the melt. Oxygen incorporation can be lessened using magnetic CZ techniques and minimized using FZ techniques as is known in the industry. Metallic impurities are generally minimized by being segregated to the tang end or left in the potscrap after the boule is brought to an end.

However, even with the above improvements in the CZ and FZ processes, there is a need and a desire to produce high purity crystalline silicon that is less expensive on a per volume basis, needs less capital investment in facilities, needs less space, and/or less complexity to operate, than known CZ and FZ processes. There is a need and a desire for a stable support system used in high temperature casting processes. There is also a need and a desire for an apparatus and a method with significant advantages over known in-crucible solidification techniques.

SUMMARY

This invention relates to an apparatus and a method of use for a high temperature apparatus for supporting and/or manipulating processing vessels, such as suitable for producing high purity silicon used in solar cells and/or solar modules. The invention may include capabilities to support crucibles that would otherwise deform and/or rupture at high temperatures. Molten silicon can readily melt steel or stainless steel structures, such that a spill of molten silicon can rapidly result in a containment failure. Such failures result in lost equipment, lost production, and can present safety issues. Other benefits of the invention may include a high purity crystalline silicon that is less expensive on a per volume basis, needs less capital investment in facilities, needs less space, and/or less complexity to operate, than known CZ and FZ processes. This invention also provides a stable support system used in high temperature casting processes. This invention also includes an apparatus and a method with significant advantages over known in-crucible solidification techniques.

According to one embodiment, this invention relates a high temperature apparatus suitable for use in producing high purity silicon. The apparatus includes one or more support ribs, one or more cross braces in combination with the one or more support ribs, optionally a top plate, and a shaped support liner positionable upon the one or more support ribs and the one or more cross braces.

According to one embodiment, this invention includes a method of processing materials suitable for producing high purity silicon. The method includes supporting a shaped support liner on one or more support ribs and one or more cross braces in combination with the one or more support ribs. The method also includes nesting a crucible within the shaped support liner, elevating the temperature of the crucible, and containing a molten feedstock within the crucible.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention. In the drawings.

DETAILED DESCRIPTION

Figure 1:
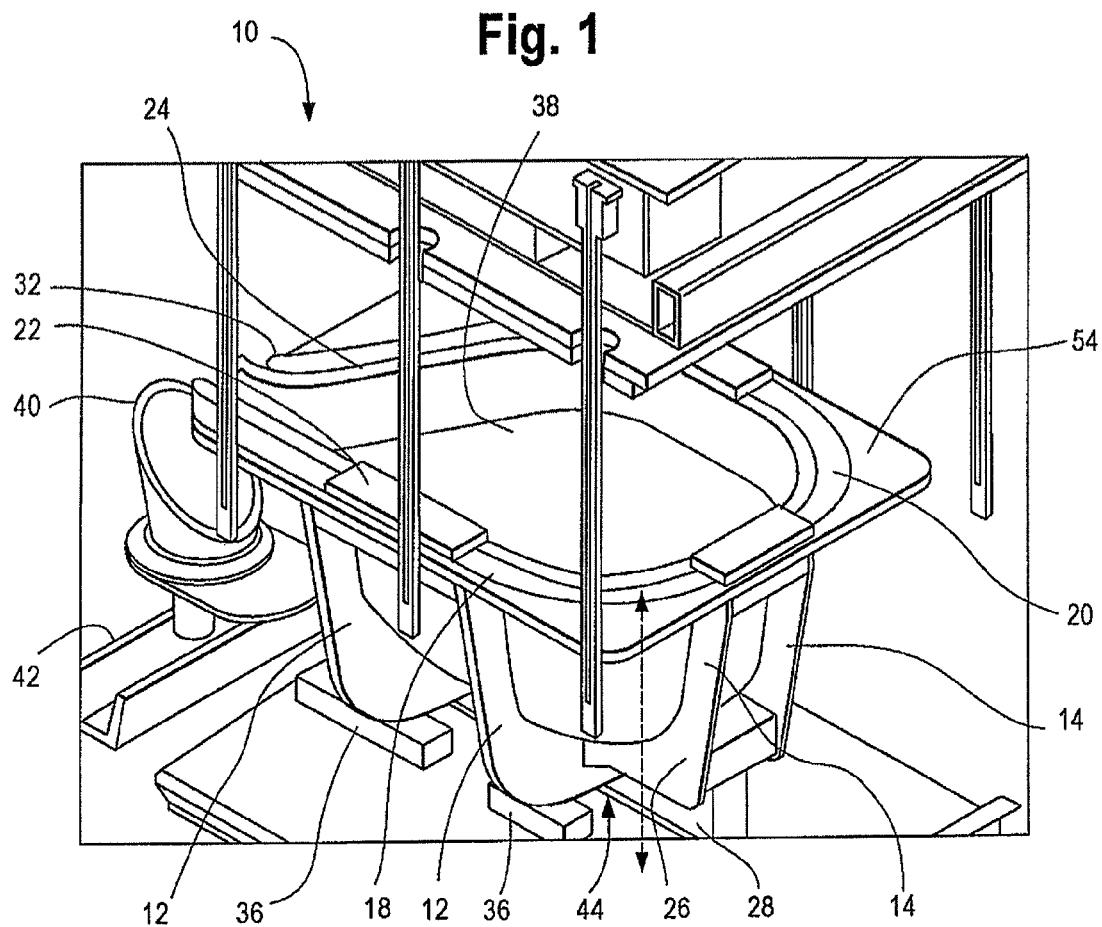
FIG. 1 illustrates an isometric view of a high temperature apparatus, according to one embodiment.

Generally, only a select set of materials can be used in contact with liquid silicon from a reactivity and contamination standpoint. One of these materials is silica, or $SiO_2$, which can be used as a crucible material in the silicon casting and melting process. Silica undergoes changes in mechanical properties in the vicinity of liquid silicon temperatures (above 1,300 degrees Celsius) making it unusable without some external support, for example. As in the case of the crucible, only a select few materials can be used in the silicon casting and melting environment due to purity, reactivity and mechanical stability constraints. Graphite and/or silicon carbide (SiC) sideplate supports can be used to limit deformation of the silica crucible during silicon melting and casting.

According to one embodiment, advanced silicon casting equipment needs to handle large volumes of silicon (greater than 500 kilograms) to store and pour the molten silicon in a safe and reliable manner. An alternative to using graphite or SiC as support materials for the alumina or silica crucible, this invention includes a new support system for large ceramic components using carbon-carbon (C—C) composite, reinforced carbon carbon (RCC) composite, and/or carbon fiber composite (CFC) members.

This invention may include ease of fabrication and reduced cost while at the same time allowing scale-up to larger sizes than feasible using conventional support members. In addition, this invention may allow manipulation (i.e. pouring) of liquid silicon from a large ceramic crucible (holding vessel) by integration of C—C members with externally activated drive trains. Conventional support members do not have adequate mechanical properties to allow such movements without failure, such as fracture.

This invention may include use in traditional casting stations while offering improvements in geometric design, fabrication limitations, and/or actual hours of service before replacement. This invention may be used in situations where deformable ceramic or metal structures need to be supported at elevated temperatures in a non-oxidizing atmosphere.

According to one embodiment, this invention includes a support system for large deformable parts at elevated temperatures in non-oxidizing atmospheres. C—C materials and corresponding structures can be used for both primary and secondary mechanical support of deformable ceramic pieces. Desirably, the structures can be attached to external mechanisms for movement and manipulation in situ. This invention can be used and/or adapted to various geometries, volumes, and/or ceramic materials.

The scope of this invention may include designing high temperature mechanical supports for deformable components in non-oxidizing atmospheres. According to one embodiment, this invention includes other materials used or integrated into the apparatus, such as silicon carbide (SiC) or silicon (Si) coatings on CFC members, RCC members, C—C members, and/or the like. The support structure of this invention may be used at any location and/or step or stage of the casting process, such as during a melting step, during a superheating step, during a refining step, during a holding step, during an accumulating step, during a solidification step, during a crystallization step, and/or the like. The scope of this invention includes single vessel casting processes as well as multi-vessel casting processes, for example, 3 stages including separate melting, holding, and solidifying.

According to one embodiment, this invention includes components made from carbon fiber reinforced carbon or carbon-fiber composite which can be referred to as C—C. The C—C material can withstand high processing temperatures in inert or non-oxidizing environments while providing sufficient mechanical integrity to allow mechanization.

FIG. 1 shows an isometric view of the high temperature apparatus 10, according to one embodiment. The high temperature apparatus 10 may include one or more support ribs 12 which can be combined with one or more cross braces 14 and/or a top plate 54 to form a frame 44. The shaped support liner 18 can be positionable within and/or on the frame 44. Desirably, the shaped support liner 18 includes a lip 20 around at least a portion of a perimeter of the support liner 18.

A crucible 24 can be placed within or positionable with respect to the shaped support liner 18. Desirably, an anchor 22 connects the lip 20 or the shaped support liner 18 to the crucible 24, such as to prevent slipping or movement during use. The frame 44 may connect to one or more stop blocks 26 and one or more crucible seats 28. The apparatus 10 may include pivots, hinge pins and/or bearings (not shown) for tipping or pouring by an actuation device (not shown), such as in an up or down direction. The crucible 24 may include one or more spouts 32, such as to aid the pouring of the molten feedstock 38 into a funnel 40 and into a channel 42. The frame 44 may be placed on one or more support frames 36, such as to support the system.

Figure 2:
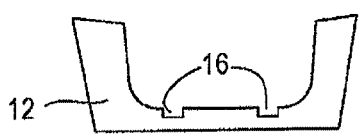
FIG. 2 illustrates a side sectional view of a support rib, according to one embodiment.
Figure 3:
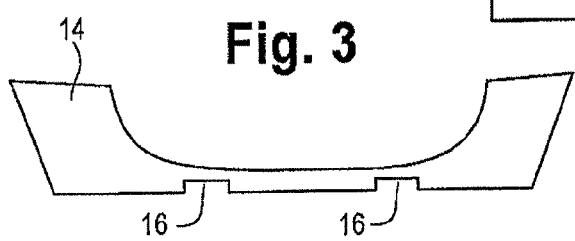
FIG. 3 illustrates a side sectional view of a cross brace, according to one embodiment.

FIG. 2 shows a side sectional view of a support rib 12 with notches 16, according to one embodiment. FIG. 3 shows a side sectional view of a cross brace 14 with notches 16, according to one embodiment. Desirably, the notches 16 of the support rib 12 mate or slidably connect with notches 16 from the cross brace 14, such as to be in combination with each other. The members may be bolted together with a mechanical fastener, combined with carbon fiber composite, and/or the like.

Figure 4:
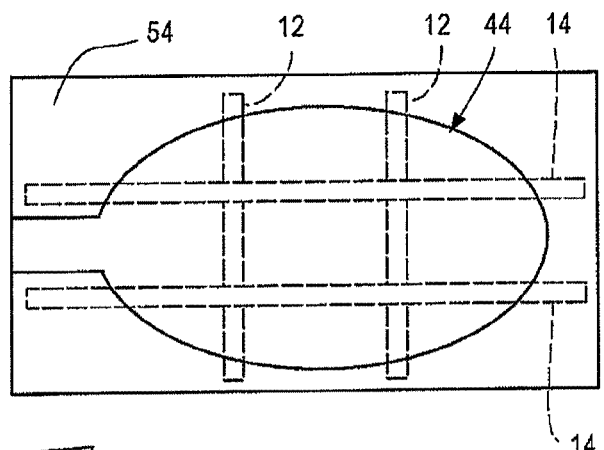
FIG. 4 illustrates a top view of an assembled frame, according to one embodiment.

FIG. 4 shows a top view of a frame 44 from assembled support ribs 12, cross braces 14 and a top plate 54, according to one embodiment. Desirably, this arrangement provides both longitudinal and lateral (transverse) support for the high temperature apparatus 10.

Figure 5:
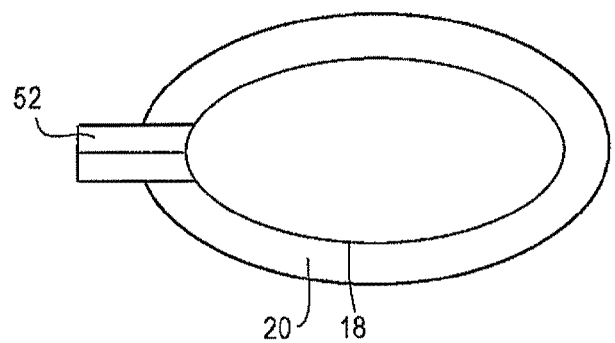
FIG. 5 illustrates a top view of a shaped support liner, according to one embodiment.
Figure 6:
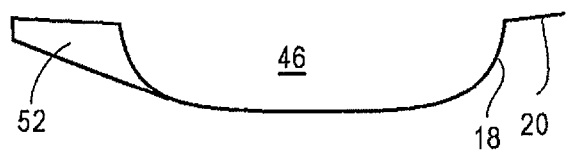
FIG. 6 illustrates a side sectional view of a shaped support liner, according to one embodiment.
Figure 7:
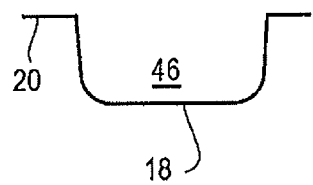
FIG. 7 illustrates a side sectional view of a shaped support liner perpendicular to the view of FIG. 6, according to one embodiment.

FIG. 5 shows a top view of a shaped support liner 18 with a lip 20, a liner volume 46, and a groove 52 for a spout (not shown), according to one embodiment. FIG. 6 shows a side sectional view of the shaped support liner 46 with a lip 20, a liner volume 46, and a groove 52 for a spout (not shown), according to one embodiment. FIG. 7 shows a side sectional view of the shaped support liner 46 with a lip 20 and a liner volume 46, perpendicular to the side sectional view of FIG. 6 and according to one embodiment.

Figure 8:
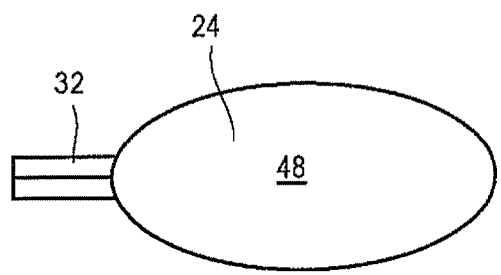
FIG. 8 illustrates a top view of a crucible, according to one embodiment.

FIG. 8 shows a top view of a crucible 24 with a spout 32 and a crucible volume 48, according to one embodiment.

Figure 9:
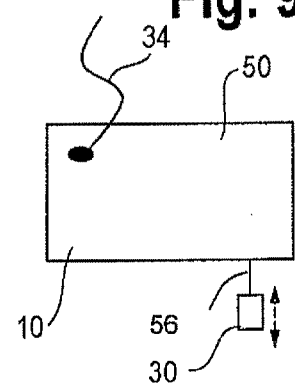
FIG. 9 illustrates a side sectional view of a high temperature apparatus

FIG. 9 shows a side sectional view of a high temperature apparatus 10 with insulation 50 surrounding the high temperature apparatus 10, according to one embodiment. Desirably, the actuation device 56 includes an external drive train 30. The high temperature apparatus 10 may include an inert gas supply 34.

Moreover, although casting of silicon has been described herein, other semiconductor materials and nonmetallic crystalline materials may be cast without departing from the scope and spirit of the invention. For example, the inventors have contemplated casting of other materials consistent with embodiments of the invention, such as germanium, gallium arsenide, silicon germanium, aluminum oxide (including its single crystal form of sapphire), gallium nitride, zinc oxide, zinc sulfide, gallium indium arsenide, indium antimonide, germanium, yttrium barium oxides, lanthanide oxides, magnesium oxide, calcium oxide, and other semiconductors, oxides, and intermetallics with a liquid phase. In addition, a number of other group III-V or group II-VI materials, as well as metals and alloys, could be cast according to embodiments of the present invention.

Cast silicon includes multicrystalline silicon, near multicrystalline silicon, geometric multicrystalline silicon, and/or monocrystalline silicon. Multicrystalline silicon refers to crystalline silicon having about a centimeter scale grain size distribution, with multiple randomly oriented crystals located within a body of multicrystalline silicon.

Geometric multicrystalline silicon or geometrically ordered multicrystalline silicon refers to crystalline silicon having a nonrandom ordered centimeter scale grain size distribution, with multiple ordered crystals located within a body of multicrystalline silicon. The geometric multicrystalline silicon may include grains typically having an average about 0.5 centimeters to about 5 centimeters in size and a grain orientation within a body of geometric multicrystalline silicon can be controlled according to predetermined orientations, such as using a combination of suitable seed crystals.

Polycrystalline silicon refers to crystalline silicon with micrometer to millimeter scale grain size and multiple grain orientations located within a given body of crystalline silicon. Polycrystalline silicon may include grains typically having an average of about submicron to about micron in size (e.g., individual grains are at most barely visible to the naked eye) and a grain orientation distributed randomly throughout.

Monocrystalline silicon refers to crystalline silicon with very few grain boundaries since the material has generally and/or substantially the same crystal orientation. Monocrystalline material may be formed with one or more seed crystals, such as a piece of crystalline material brought in contact with liquid silicon during solidification to set the crystal growth. Near monocrystalline silicon refers to generally crystalline silicon with more grain boundaries than monocrystalline silicon but generally substantially fewer than multicrystalline silicon.

According to one embodiment, this invention may include a high temperature apparatus suitable for use in producing high purity silicon. The apparatus may include one or more support ribs, one or more cross braces in combination with the one or more support ribs, optionally a top plate on top of the one or more support ribs and/or the one or more cross braces, and a shaped support liner positionable upon the one or more support ribs and the one or more cross braces.

High temperature broadly includes elevated or increased temperatures, such as at least about 500 degrees Celsius, at least about 1,000 degrees Celsius, at least about 1,400 degrees Celsius, at least about 1,412 degrees Celsius (melting point of silicon), at least about 1,450 degrees Celsius, at least about 1,500 degrees Celsius, and/or any other suitable number.

Support ribs broadly refer to structural members disposed or positioned along a length of a vessel, such as to support a liner and/or a crucible. Desirably, but not necessarily, the support ribs include a substantially conforming interior contour to the liner and/or the crucible. The support rib may include any suitable shape, thickness, and/or size. The support rib may include a generally U-shape, such as with a generally flat external bottom profile. According to one embodiment, the support rib may include one or more joints and/or intersections for receiving and/or combining with other members of the apparatus. The joint may include a slot or a notch, such as for sliding and/or accepting a portion of the other member. In the alternative, a portion of the support rib slides into a notch in or into the other member.

Any suitable number of support ribs is possible, such as about 2, about 4, about 6, about 8, and/or any other number to support the high temperature apparatus. Desirably, but not necessarily, the support ribs can be disposed and/or configured along a width (minor axis) of the vessel. In the alternative the support ribs may be disposed and/or configured along a length (major axis) of the vessel. The support ribs can be disposed and/or configured at any suitable angle with respect to the vessel, such as generally perpendicular or transverse to a length. Diagonal and/or oblique angles are within the scope of this invention.

Cross braces broadly refer to structural members disposed or positioned along a length of a vessel, such as to support a liner and/or a crucible. Desirably, but not necessarily, the cross braces include a substantially conforming interior contour to the liner and/or the crucible. The cross brace may include any suitable shape, thickness, and/or size. The cross brace may include a generally U-shape, such as with a generally flat external bottom profile. According to one embodiment, the cross brace may include one or more joints and/or intersections for receiving and/or combining with other members of the apparatus. The joint may include a slot or a notch, such as for sliding and/or accepting a portion of the other member. In the alternative, a portion of the cross brace slides into a notch in or into the other member.

Any suitable number of cross braces is possible, such as about 2, about 4, about 6, about 8, and/or any other number to support the high temperature apparatus. Desirably, but not necessarily, the cross braces can be disposed and/or configured along a length (major axis) of the vessel. In the alternative the cross braces may be disposed and/or configured along a width (minor axis) of the vessel. The cross braces can be disposed and/or configured at any suitable angle with respect to the vessel, such as generally perpendicular or transverse to a length. Diagonal and/or oblique angles are within the scope of this invention.

In combination broadly refers to two or more items disposed with respect to each other, such as to perform the same function. The support ribs and the cross braces may be disposed and/or configured in any suitable manner, such as generally perpendicular with respect to each other. Other configurations and/or angles of support ribs and cross braces are possible.

In the alternative, the support structure of the high temperature apparatus may be referred to as having a keel (longitudinal member) and a brace (transverse member) with a hull (shell or skin).

The shaped support liner broadly refers to a shell, a vessel, and/or a device for providing external support and/or containment, such as to a crucible and/or other process vessel. Desirably, but not necessarily, the shaped support liner at least generally conforms to an exterior shape of the vessel. According to one embodiment, the shaped support liner includes allowances for thermal expansion of the vessel, such as where silica expands relative to a C—C material of the shaped support liner.

According to one embodiment, the shaped support liner includes tapered walls, such as to push a cooling crucible generally upward and/or outward. A crucible may deform at high temperature and closely conform to the shaped support liner. During cool-down, the conformed shaped support liner may contract (shrink) more than the crucible, causing binding, seizing, and/or cracking one or more of the components. The tapered walls of the shaped support liner may include any suitable angle or orientation, such as wider at the top than the bottom in cross section of the shaped support liner. The angle may be at least about 2 degrees, at least about 3 degrees, at least about 5 degrees, at least about 10 degrees, and/or the like.

The shaped support liner may include any suitable size and/or shape. The shaped support liner may include a generally rigid, relatively thin design, such as supporting a ceramic crucible that has become at least somewhat pliable and/or deformable at elevated temperatures. The shaped support liner may include any suitable volume or capacity, such as to hold a crucible containing at least about 500 kilograms of molten silicon, at least about 700 kilograms of molten silicon, at least about 1,000 kilograms of molten silicon, and/or any other quantity.

The shaped support liner may have a shape or contour, such as generally a bathtub shape, a half an egg shape, a generally trough shape, a generally cubic shape, and/or the like. Desirably, the shaped support liner includes a profile to support a pour spout or a V-shape in the crucible, such as to pour or decant the contents of the crucible. The shaped support liner may include a lip and/or other generally planar or flat section along and/or around a top portion of the shaped support liner, such as for containing or catching molten feedstock and/or providing an attachment or anchor point to the actuation mechanism, the support structure, to hold the crucible, and/or the like.

The shaped support liner in combination with the support ribs and/or the cross braces can provide sufficient support for the deformable crucible, such as to prevent no more displacement than about ±5 millimeters, about ±2 millimeters, about ±0.5 millimeters, and/or the like. In the alternative, the shaped support liner can be designed to bear and/or structurally contain the crucible and the contents of the crucible.

According to one embodiment, the support ribs, the cross braces, and optionally the top plate are integrally formed in a generally unitary structure, such as during the composite fabrication process where the lay-up and pyrolysis form a singular frame. The shaped support liner may also be laid-up at the same time as of the frame and may produce and integral assembly. In the alternative, the support ribs, the cross braces, the top plate, and the shaped support liner may each be independently fabricated.

Components or parts of the apparatus may be held together using any suitable mechanical and/or chemical fastener, such as bolts, nuts, screws, rivets, and/or the like. The fasteners may include any suitable material, such as graphite, ceramic, alloy metals, and/or the like. Desirably, the attachment of the various parts takes into account or provides for the anisotropy of the coefficient of thermal expansion (CTE) in C—C materials.

Anisotropy broadly refers to exhibiting properties with different values when measured in different directions, such as greater growth (expansion) in a first direction when heated than growth a direction perpendicular to the first direction based on fiber orientation. Fastening, securing, anchoring, bolting and/or screwing can be matched to the CTE of the direction that they constrain, such as by providing slots or elongated holes. CTE can be considered in design and configuration of materials for connection of different parts.

C—C materials and/or parts may generally be formed by laying-up and/or arranging carbon fiber filament and/or carbon fiber cloth into the desired shape. Single and/or multiple layers of material can be used and desirably different layers include different orientations and/or patterns, such as a first layer having a first orientation and a second layer having about a generally perpendicular orientation to the first layer. The use of continuous filaments, staple fibers, bulk fibers, woven fabrics, and/or nonwoven fabrics is within the scope of this invention. Unidirectional, bidirectional, and/or multidirectional filament or fabric orientations are possible.

The lay-up can be coated with organic binder or pitch, such as containing coke or another carbon source. The lay-up can be heated or warmed to perform pyrolysis (elevated temperatures with reduced and/or no oxygen) and to form a generally pure carbon. Voids formed from the pyrolysis can be reduced or filled in by contact with a carbon depositing or forming gas, such as acetylene at high temperature for extended periods and/or several days. The elevated temperature may also promote and/or grow larger graphite crystals. Optionally, a surface of the C—C material may include a graphite foil layer applied during the manufacturing process, such as to seal and/or protect the C—C components.

According to one embodiment, the one or more support ribs, the one or more cross braces, the top plate, and/or the shaped support liner may include a ceramic material, such as a high temperature ceramic that can withstand the elevated temperatures and/or non-oxidizing atmosphere, but may not be suitable for direct contact with molten silicon. High temperature ceramics may include aluminum oxide, aluminum nitride, aluminum silicate, boron nitride, zirconium phosphate, zirconium diboride, hafnium diboride, and/or the like.

According to one embodiment, the one or more support ribs, the one or more cross braces, the top plate, and/or the shaped support liner may include carbon fiber composite. Combinations of ceramics and C—C parts are within the scope of this invention.

This invention may also include a crucible positionable within the shaped support liner. Crucible broadly refers to a vessel or a device for holding the contents (liquid or solid) at elevated temperatures. The crucible may be made of ceramic, such as alumina, silica, or fused silica. The crucible may include any suitable size and/or shape, such as generally corresponding to the characteristics described above with respect to the shaped support liner.

According to one embodiment, this invention includes an actuation device for transferring a liquid feedstock from the crucible. The activation device may include hydraulics, pneumatics, motor drives, and/or the like. The actuation device may include any suitable combination of levers, screws, pivots, linkages, connections and/or the like. Desirably, the actuation device can tip at least one end of the crucible to at least about 20 degrees from horizontal, at least about 45 degrees from horizontal, at least about 60 degrees from horizontal, at least about 90 degrees from horizontal, and/or any other suitable angle. The tipping may include raising, lowering, or a combination of raising and lowering a portion of the crucible. In the alternative, the tipping includes pivoting the crucible, such as about an axis.

The actuation device may include any suitable configuration, such as an external drive train remote from a hot process area (outside insulation and exposed to ambient conditions). In the alternative, the drive train includes high temperature components within the high temperature apparatus. According to one embodiment, the actuation device includes a pneumatic cylinder with a travel or movable distance of at least greater than about twice a depth of the crucible. The cylinder may be disposed generally vertically with respect to the apparatus, and raising or lowering one end of the crucible (opposite the spout). In the alternative, the cylinder may be positioned at a suitable angle, such as about 30 degrees, about 60 degrees, and/or the like. The other end of the crucible can be pivotably supported, such as to allow movement and tipping. Other configurations of the actuation device are within the scope of this invention.

The apparatus may support any suitable mass at any suitable temperature, such as supporting a mass of at least about 500 kilograms of a feedstock at a temperature of at least about 1,412 degrees Celsius. Desirably, the apparatus can withstand superheat above a melting point of the feedstock, such as at least about 10 degrees Celsius of superheat, at least about 25 degrees Celsius of superheat, at least about 50 degrees Celsius of superheat, and/or any other suitable value.

According to one embodiment, the one or more support ribs may include a first rib disposed along about ⅓ a length of the shaped support liner and a second rib disposed along about ⅔ the length of the shaped support liner. The one or more support braces may include a first cross brace disposed about 10 percent off center of the shaped support liner and a second cross brace disposed about 10 percent off center of the shaped support liner on an opposite side of the first cross brace. Symmetrical and nonsymmetrical configurations are within the scope of this invention.

According to one embodiment, the shaped support liner includes a generally rectangular shape with a spout disposed or located on an edge and/or in a corner, such as generally opposite the actuation device. Desirably, the crucible includes generally rounded or smoothed shapes and/or transitions.

As used herein the terms "having", "comprising", and "including" are open and inclusive expressions. Alternately, the term "consisting" is a closed and exclusive expression. Should any ambiguity exist in construing any term in the claims or the specification, the intent of the drafter is toward open and inclusive expressions.

Regarding an order, number, sequence and/or limit of repetition for steps in a method or process, the drafter intends no implied order, number, sequence and/or limit of repetition for the steps to the scope of the invention, unless explicitly provided.

According to one embodiment, this invention may include a method of processing materials suitable for producing high purity silicon. The method may include the step of supporting a shaped support liner on one or more support ribs and/or one or more cross braces in combination with the one or more support ribs. The invention may include the steps of nesting, placing, or fitting a crucible within the shaped support liner, elevating a temperature of the crucible, and containing a molten feedstock within the crucible.

The step of elevating the temperature may include applying and/or using a heating device to warm the crucible, such as graphite resistance heaters or copper water-cooled inductive heaters. In the alternative, the heating may be accomplished by supply or pouring superheated feedstock into the crucible.

The step of containing the molten feedstock broadly refers to not spilling or losing containment of the vessel contents. In the alternative, the containing includes preventing deformation of the crucible shape, such as by supporting the crucible with the shaped support liner.

As discussed above, the elevated temperature includes any suitable value, such as where a temperature of the crucible includes at least about 1,412 degrees Celsius. The temperature of the crucible may exceed a softening temperature or a deformation temperature of the crucible, such as where the crucible becomes pliable and/or softens. The method may include adding and/or supplying heat to the molten feedstock, such as to melt the feedstock and/or add superheat above the melting point of the feedstock.

The method may include where the one or more support ribs, the one or more cross braces, the top plate, and/or the shaped support liner includes carbon fiber composite.

According to one embodiment, the method includes, draining or pouring a contents of the crucible by tipping with an actuation device, and flowing or pouring the molten feedstock in and/or through a spout or a nozzle of the crucible. The method may include transferring or moving the molten feedstock to the crucible from a melting apparatus.

A volume of the molten feedstock may comprise any suitable amount, such as at least about 0.1 meters cubed, at least about 0.2 meters cubed, at least about 0.5 meters cubed, at least about 0.8 meters cubed, at least about 1.0 meters cubed, and/or the like. The molten feedstock may include high purity silicon and/or any other suitable material.

The method may include solidifying the molten feedstock in the crucible. Desirably, the method may include controlling an atmosphere of the crucible with an inert gas, such as blanketing with argon or another suitable gas.

According to one embodiment, the method may include maintaining a temperature of at least about 1,300 degrees Celsius or other suitable elevated temperature, as discussed above, during multiple fillings and pourings-outs or casting cycles of the apparatus (support ribs, cross braces, and shaped support liner). The period for maintaining the elevated temperature may include any suitable duration, such as at least about 15 minutes, at least about 0.5 hours, at least about 1 hour, at least about 5 hours, at least about 10 hours, and/or the like. The multiple cycles may include any suitable number, such as at least about 2 cycles, at least about 5 cycles, at least about 10 cycles, at least about 25 cycles, at least about 50 cycles, and/or the like. Desirably, the apparatus may complete the multiple casting cycles without the need for replacement or disassembly.

It will be apparent to those skilled in the art that various modifications and variations can be made in the disclosed structures and methods without departing from the scope or spirit of the invention. Particularly, descriptions of any one embodiment can be freely combined with descriptions or other embodiments to result in combinations and/or variations of two or more elements or limitations. Other embodiments of the invention will be apparent to those skilled in the art from consideration of the specification and practice of the invention disclosed herein. It is intended that the specification and examples be considered exemplary only, with a true scope and spirit of the invention being indicated by the following claims.

What is claimed is:

1. A high temperature apparatus suitable for use in producing high purity silicon, the apparatus comprising:
    one or more support ribs;
    one or more cross braces in combination with the one or more support ribs;
    a top plate on top of at least one of the one or more support ribs and/or the one or more cross braces; and
    a shaped support liner positionable upon the one or more support ribs and the one or more cross braces;
    wherein the ribs are positioned along a length of the shaped support liner and the cross braces are positioned along a width of the shaped support liner and;
    wherein at least one of the one or more support ribs and at least one of the one or more cross braces comprises at least one selected from the group consisting of RCC, C—C and CFC.

2. The apparatus of claim 1, wherein the one or more support ribs, the one or more cross braces, and the shaped support liner comprises ceramic material.

3. The apparatus of claim 1, wherein the one or more support ribs, the one or more cross braces, and the shaped support liner comprises carbon fiber composite.

4. The apparatus of claim 1, further comprising a crucible positionable within the shaped support liner.

5. The apparatus of claim 4, wherein the crucible comprises fused silica.

6. The apparatus of claim 4, further comprising an actuation device for transferring a liquid feedstock from the crucible.

7. The apparatus of claim 6, wherein the actuation device comprises an external drive train.

8. The apparatus of claim 4, wherein at least part of one of the one or more support ribs or the one or more cross braces comprises an interior contour which at least partly conforms to an exterior contour of the liner and/or crucible.

9. The apparatus of claim 1, wherein the apparatus supports at least about 500 kilograms of a feedstock at a temperature of at least about 1,412 degrees Celsius.

10. The apparatus of claim 1, wherein the one or more ribs comprises a first rib disposed along about ⅓ a length of the shaped support liner and a second rib disposed along about ⅔ the length of the shaped support liner.

11. The apparatus of claim 1, wherein the shaped support liner comprises a generally rectangular shape with a spout disposed on an edge.

12. The apparatus of claim 1, wherein the edge comprises a corner.

* * * * *